US010729008B2

(12) United States Patent
Ueda et al.

(10) Patent No.: US 10,729,008 B2
(45) Date of Patent: Jul. 28, 2020

(54) FLEXIBLE PRINTED CIRCUIT BOARD

(71) Applicant: SUMITOMO ELECTRIC PRINTED CIRCUITS, INC., Koka-shi, Shiga (JP)

(72) Inventors: Hiroshi Ueda, Koka (JP); Kousuke Miura, Koka (JP); Kou Noguchi, Koka (JP)

(73) Assignee: SUMITOMO ELECTRIC PRINTED CIRCUITS, INC., Koka-shi, Shiga (JP)

( * ) Notice: Subject to any disclaimer, the term of this patent is extended or adjusted under 35 U.S.C. 154(b) by 0 days.

(21) Appl. No.: 16/474,727

(22) PCT Filed: Dec. 21, 2017

(86) PCT No.: PCT/JP2017/045861
§ 371 (c)(1),
(2) Date: Jun. 28, 2019

(87) PCT Pub. No.: WO2018/128082
PCT Pub. Date: Jul. 12, 2018

(65) Prior Publication Data
US 2020/0037434 A1    Jan. 30, 2020

(30) Foreign Application Priority Data
Jan. 5, 2017  (JP) ................. 2017-000602

(51) Int. Cl.
*H05K 1/02*    (2006.01)
(52) U.S. Cl.
CPC .......... *H05K 1/028* (2013.01); *H05K 1/0245* (2013.01); *H05K 1/0271* (2013.01); *H05K 2201/09254* (2013.01); *H05K 2201/09272* (2013.01)
(58) Field of Classification Search
CPC .......... H05K 2201/09272; H05K 2201/09254; H05K 2201/09218; H05K 2201/09209;
(Continued)

(56) References Cited

U.S. PATENT DOCUMENTS 5,764,489 A * 6/1998 Leigh ................. H05K 1/0219
                                                      174/261
6,642,819 B1 * 11/2003 Jain ......................... H01P 1/02
                                                      333/128
(Continued)

FOREIGN PATENT DOCUMENTS

JP   S60-187551 U    12/1985
JP   H11-340591 A    12/1999

OTHER PUBLICATIONS

International Search Report dated Apr. 3, 2018 for PCT/JP2017/045861.
(Continued)

*Primary Examiner* — Steven T Sawyer
(74) *Attorney, Agent, or Firm* — Faegre Drinker Biddle & Reath LLP

(57) ABSTRACT

A flexible printed circuit board according to an embodiment of the present invention includes an insulative base film; and a conductive pattern provided on at least one surface of the base film and including a wiring line including a bent portion having an angle of greater than or equal to 60° or a branched portion having an angle of greater than or equal to 60° in plan view. The wiring line is provided with a relaxation structure that relaxes stress concentration at the bent portion or the branched portion. The relaxation structure is structured such that the wiring line constitutes a wide wiring line or a dense wiring line group in a region in which a distance from the bent portion or the branched portion is less than or equal to 5 times a minimum width of the wiring line. The wide wiring line has a wiring line width that is greater than or equal to twice the minimum width of the wiring line. A ratio of a wiring line width to a wiring line interval of the dense wiring line group is greater than or equal to 1.5, and
(Continued)

a total width of the dense wiring line group is greater than or equal to twice the minimum width of the wiring line.

3 Claims, 7 Drawing Sheets

(58) Field of Classification Search
CPC ....... H05K 1/0245; H05K 2201/09236; H05K 1/028; H05K 1/0281; H05K 2201/09227; H05K 2201/09263
See application file for complete search history.

(56) References Cited

U.S. PATENT DOCUMENTS

| | | | | |
|---|---|---|---|---|
| 2006/0091973 A1* | 5/2006 | Zimmerling | ............... | H01P 1/02 |
| | | | | 333/116 |
| 2007/0063782 A1* | 3/2007 | Kanno | .................... | H01P 3/081 |
| | | | | 333/4 |
| 2008/0121412 A1* | 5/2008 | Yamada | ................. | H05K 3/125 |
| | | | | 174/250 |
| 2015/0053460 A1* | 2/2015 | Kunimoto | ............ | H05K 3/4602 |
| | | | | 174/251 |
| 2015/0214596 A1* | 7/2015 | Kawai | ..................... | H01P 3/026 |
| | | | | 333/4 |

OTHER PUBLICATIONS

Written Opinion of the International Searching Authority dated Apr. 3, 2018 for PCT/JP2017/045861.

* cited by examiner

FLEXIBLE PRINTED CIRCUIT BOARD

TECHNICAL FIELD

The present invention relates to a flexible printed circuit board.

The present application claims priority based on "Japanese Patent Application No. 2017-000602" filed on Jan. 5, 2017, the entire contents of which are incorporated herein.

BACKGROUND ART

Flexible printed circuit boards have been broadly used. A flexible printed circuit board includes an insulative base film and a conductive pattern that is provided on at least one surface of the base film and that includes a wiring line having a bent portion or a branched portion in plan view.

The flexible printed circuit board may be used while the surfaces thereof are bent at a certain angle, and may be fatigued as a result of repeated changes in the bent state during usage. Accordingly, the bent portion or the branched portion of the conductive pattern may receive a concentrated stress and become disconnected depending on the conditions of use.

For example, Japanese Unexamined Patent Application Publication No. 11-340591 proposes a method for preventing concentration of stress at a crossing portion of wiring lines of a conductive pattern by providing a fillet at a corner of the crossing portion.

CITATION LIST

Patent Literature

PTL 1: Japanese Unexamined Patent Application Publication No. 11-340591

SUMMARY OF INVENTION

A flexible printed circuit board according to an embodiment of the present invention includes an insulative base film; and a conductive pattern provided on at least one surface of the base film and including a wiring line including a bent portion having an angle of greater than or equal to 60° or a branched portion having an angle of greater than or equal to 60° in plan view. The wiring line is provided with a relaxation structure that relaxes stress concentration at the bent portion or the branched portion. The relaxation structure is structured such that the wiring line constitutes a wide wiring line or a dense wiring line group in a region in which a distance from the bent portion or the branched portion is less than or equal to 5 times a minimum width of the wiring line. The wide wiring line has a wiring line width that is greater than or equal to twice the minimum width of the wiring line. A ratio of a wiring line width to a wiring line interval of the dense wiring line group is greater than or equal to 1.5, and a total width of the dense wiring line group is greater than or equal to twice the minimum width of the wiring line.

DESCRIPTION OF EMBODIMENTS

Figure 1:
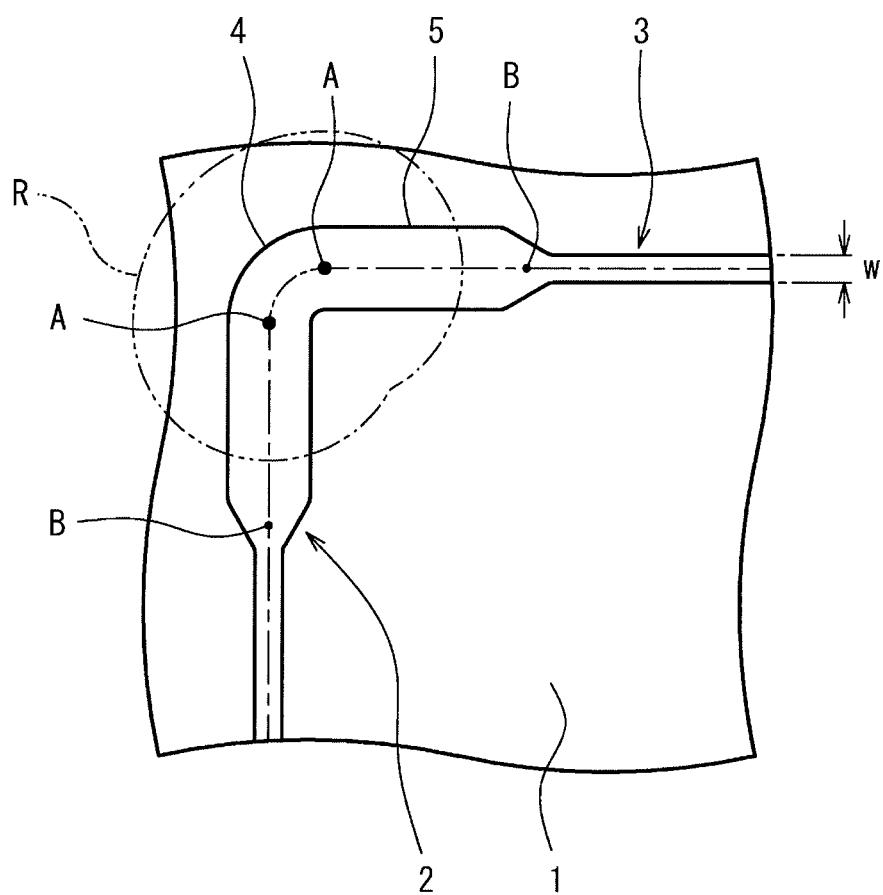
FIG. 1 is a schematic plan view of a flexible printed circuit board according to an embodiment of the present invention.

Problems to be Solved by Present Disclosure

The design of the conductive pattern according to the related art proposed by the above-described publication prevents disconnection in an unflexible rigid circuit board, and cannot easily sufficiently prevent breakage of a conductive pattern when applied to a flexible printed circuit board that is bent by a relatively large amount.

In particular, electronic devices have been reduced in size in recent years, and widths of wiring lines in the conductive pattern on the flexible printed circuit board and the bending radius of the flexible printed circuit board have been reduced accordingly. Therefore, breakage of the conductive pattern on the flexible printed circuit board has become a greater problem.

The present invention has been made in the above-described circumstances, and an object thereof is to provide a flexible printed circuit board capable of preventing breakage of a bent portion or a branched portion of a conductive pattern due to stress concentration.

Advantageous Effects of Present Disclosure

A flexible printed circuit board according to an embodiment of the present invention is capable of preventing breakage of a bent portion or a branched portion of a conductive pattern due to stress concentration.

DESCRIPTION OF EMBODIMENTS OF PRESENT INVENTION

A flexible printed circuit board according to an embodiment of the present invention includes an insulative base film; and a conductive pattern provided on at least one surface of the base film and including a wiring line including a bent portion having an angle of greater than or equal to 60° or a branched portion having an angle of greater than or equal to 60° in plan view. The wiring line is provided with a relaxation structure that relaxes stress concentration at the bent portion or the branched portion. The relaxation structure is structured such that the wiring line constitutes a wide wiring line or a dense wiring line group in a region in which a distance from the bent portion or the branched portion is less than or equal to 5 times a minimum width of the wiring line. The wide wiring line has a wiring line width that is greater than or equal to twice the minimum width of the wiring line. A ratio of a wiring line width to a wiring line interval of the dense wiring line group is greater than or equal to 1.5, and a total width of the dense wiring line group is greater than or equal to twice the minimum width of the wiring line.

The flexible printed circuit board includes a relaxation structure in which the wiring line constitutes the wide wiring line or the dense wiring line group that satisfies the above-described conditions in a surrounding region including the bent portion or the branched portion of the conductive pattern. Accordingly, the wiring line provided with the relaxation structure is more difficult to deform than other portions, and stress can be dispersed. Therefore, breakage of the bent portion or the branched portion of the wiring line in the conductive pattern due to stress concentration can be prevented.

The wiring line width of the wide wiring line is preferably greater than or equal to 50 μm. When the minimum width of the wide wiring line is greater than or equal to the above-described lower limit, the stress can be more reliably dispersed and breakage of the bent portion or the branched portion of the wiring line in the conductive pattern can be more reliably prevented.

The dense wiring line group preferably includes a dummy wiring line that is not connected to the circuit. When the dense wiring line group includes a dummy wiring line that is not connected to the circuit, portions of the conductive pattern that form the circuit may be similar to those of the related art. Therefore, the conductive pattern can be relatively easily designed.

The wiring line interval of the dense wiring line group is preferably less than or equal to 20 μm. When the wiring line interval of the dense wiring line group is less than or equal to the upper limit, stress concentration at the wiring line in the dense wiring line group can be more easily prevented.

Here, the "bent portion" is a portion in which the radius of curvature of the centerline of the wiring line is less than or equal to 5 times the minimum width of the entire wiring line, and the "angle" of the bent portion means the angle between centerlines at points where the radius of curvature of the centerline of the wiring line is 5 times the minimum width of the entire wiring line. The "branched portion" means a portion at which the centerline of the wiring line is branched, and the "angle" of the branched portion means the smaller one of relative angles between centerlines at points where the radii of curvature of any two of the centerlines into which the centerline of the wiring line is branched are greater than or equal to 5 times the minimum width of the entire wiring line. The "distance from the bent portion or the branched portion" means the distance from the centerline of the bent portion or the branched portion of the wiring line. The "wide wiring line" is a wiring line having a wiring line width greater than the wiring line width (minimum width) of the wiring line outside the relaxation structure. The "dense wiring line group" is a plurality of wiring lines for which a ratio of a wiring line width to a wiring line interval is greater than that for wiring lines outside the relaxation structure and which has a total width that is greater than a wiring line width (minimum width) of the wiring lines outside the relaxation structure. Here, the "total width" is the sum of wiring line widths of the wiring lines included in the dense wiring line group.

Detailed Description of Embodiments of Present Invention

Flexible printed circuit boards according to embodiments of the present invention will now be described in detail with reference to the drawings.

First Embodiment

A flexible printed circuit board according to a first embodiment of the present invention illustrated in FIG. 1 includes an insulative base film 1 and a conductive pattern 2 provided on at least one surface of the base film 1.

<Base Film>

The base film 1 is a member that supports the conductive pattern 2 and a structural member that ensures sufficient strength of the flexible printed circuit board.

The base film 1 may be mainly made of, for example, a soft material, a hard material, or a rigid-flexible material which is a composite material including a soft material and a hard material. Examples of soft materials include polyimide, a liquid crystal polymer, which is typically liquid crystal polyester, polyethylene terephthalate, polyethylene naphthalate, polyphenylene ether, and fluororesin. Examples of hard materials include paper phenol, paper epoxy, glass composite, glass epoxy, and a glass base material. In particular, polyimide, which is highly heat resistant, is preferred. The base film 1 may have a porous structure, and may include, for example, a filler and an additive.

The thickness of the above-described base film 1 is not particularly limited. For example, the lower limit of the average thickness of the base film 1 is preferably 5 μm, and more preferably 12 μm. The upper limit of the average thickness of the base film 1 is preferably 2 mm, and more preferably 1.6 mm. When the average thickness of the base film 1 is less than the above-described lower limit, there is a risk that the strength of the base film 1 will be insufficient. When the average thickness of the base film 1 is greater than the upper limit, there is a risk that the flexibility of the flexible printed circuit board may be insufficient.

<Conductive Pattern>

The conductive pattern 2 is formed by at least partially patterning a conductor layer to form a circuit. The conductive pattern 2 includes at least one wiring line 3. Although not illustrated, the conductive pattern 2 may also include, for example, a land for enabling an electronic component to be mounted thereon and a terminal for providing wiring line connection.

The material of the conductive pattern 2 is not particularly limited as long as the material is conductive, and may be, for example, a metal such as copper, aluminum, or nickel. In general, copper, which is relatively inexpensive and highly conductive, is used. The conductive pattern 2 may have a plated surface.

The wiring line 3 included in the conductive pattern 2 includes a bent portion 4 having a radius of curvature that is less than or equal to 5 times a minimum width w of the wiring line 3 and an angle of greater than or equal to 60°. More specifically, the bent portion 4 is a region in which the radius of curvature of the centerline of the wiring line 3 (one-dot chain line in FIG. 1) is continuously less than or equal to 5 times the minimum width w and in which the directions of the centerline at both ends of the region differ from each other by an angle greater than or equal to 60°. The minimum width w is a minimum width of an effective portion of the wiring line 3 that serves as a conductive path.

The flexible printed circuit board illustrated in FIG. 1 will be described. The bent portion 4 of the wiring line 3 is a portion between points A-A in which the radius of curvature of the centerline is twice the minimum width w of the wiring line 3 and that has an angle of approximately 90°.

The lower limit of the minimum width w of the entire wiring line 3 is preferably 10 μm, and more preferably 15 μm. The upper limit of the minimum width w of the wiring line 3 is preferably 200 μm, and more preferably 100 μm. When the minimum width w of the wiring line 3 is less than the lower limit, there is a risk that the conductivity of the wiring line 3 will be insufficient. When the minimum width w of the wiring line 3 is greater than the upper limit, the wiring line 3 is relatively strong even when the present invention is not applied. Therefore, there is a risk that the area of the flexible printed circuit board will be unnecessarily large when the present invention is applied.

The wiring line 3 is provided with a relaxation structure that relaxes stress concentration at the bent portion 4. The relaxation structure according to the present embodiment is a structure in which the wiring line 3 constitutes a wide wiring line 5 having a wiring line width that is greater than or equal to twice the minimum width (wiring line width of other portion) w of the wiring line 3 in a surrounding region R including the bent portion 4 (region indicated by the two-dot chain line). More specifically, the wiring line width of the wiring line 3 varies in a region outside the surrounding region R, and the wiring line width of the wiring line 3 in the surrounding region R is greater than or equal to twice the minimum width w of the entire wiring line.

The lower limit of the distance from the bent portion 4 (centerline between points A-A) to end portions of the wide wiring line 5 (points B at which the wiring line width changes to twice the minimum width w of the entire wiring line 3) along the centerline of the wiring line 3 may be 5 times, preferably 8 times, more preferably 10 times the minimum width w of the wiring line 3. The upper limit of the distance from the bent portion 4 to the end portion (points B) of the wide wiring line 5 is preferably 50 times, more preferably 30 times the minimum width w of the wiring line 3. When the distance from the bent portion 4 to the end portions of the wide wiring line 5 is less than the above-described lower limit, there is a risk that breakage of the wiring line 3 due to stress concentration at the bent portion 4 cannot be prevented. When the distance from the bent portion 4 to the end portions of the wide wiring line 5 is greater than the upper limit, there is a risk that the area of the flexible printed circuit board will be unnecessarily large.

The lower limit of the wiring line width of the wide wiring line 5 is preferably 50 μm, and more preferably 60 μm. The upper limit of the wiring line width of the wide wiring line 5 is preferably 500 μm, and more preferably 200 μm. When the wiring line width of the wide wiring line 5 is less than the lower limit, there is a risk that breakage of the wiring line 3 at the bent portion 4 cannot be reliably prevented. When the wiring line width of the wide wiring line 5 is greater than the upper limit, there is a risk that the area of the flexible printed circuit board will be unnecessarily large.

The lower limit of the wiring line width of the bent portion 4 of the wiring line 3 (wiring line width of the wide wiring line 5 in the region between points A-A) is preferably 2.5 times, more preferably 3 times the minimum width w of the wiring line 3. The upper limit of the wiring line width of the bent portion 4 of the wiring line 3 is preferably 10 times, more preferably 7 times the minimum width w of the wiring line 3. When the wiring line width of the bent portion 4 of the wiring line 3 is less than the lower limit, there is a risk that stress concentration at the bent portion 4 cannot be sufficiently reduced. When the wiring line width of the bent portion 4 of the wiring line 3 is greater than the upper limit, there is a risk that the area of the flexible printed circuit board will be unnecessarily large.

The lower limit of the average thickness of the conductive pattern 2 is preferably 2 μm, and more preferably 5 μm. The upper limit of the average thickness of the conductive pattern 2 is preferably 500 μm, and more preferably 100 μm. When the average thickness of the conductive pattern 2 is less than the lower limit, there is a risk that sufficient conductivity cannot be provided. When the average thickness of the conductive pattern 2 is greater than the upper limit, there is a risk that the flexibility of the flexible printed circuit board will be insufficient.

Advantages

As described above, the wiring line 3 constitutes the wide wiring line 5 in the surrounding region R in which the distance from the bent portion 4 is less than or equal to at least 5 times the minimum width w of the wiring line 3. Accordingly, when the flexible printed circuit board receives a bending stress, stress concentration at the bent portion 4 of the wiring line 3 is relaxed, and breakage of the wiring line 3 at and around the bent portion 4 can be prevented.

Second Embodiment

Figure 2:
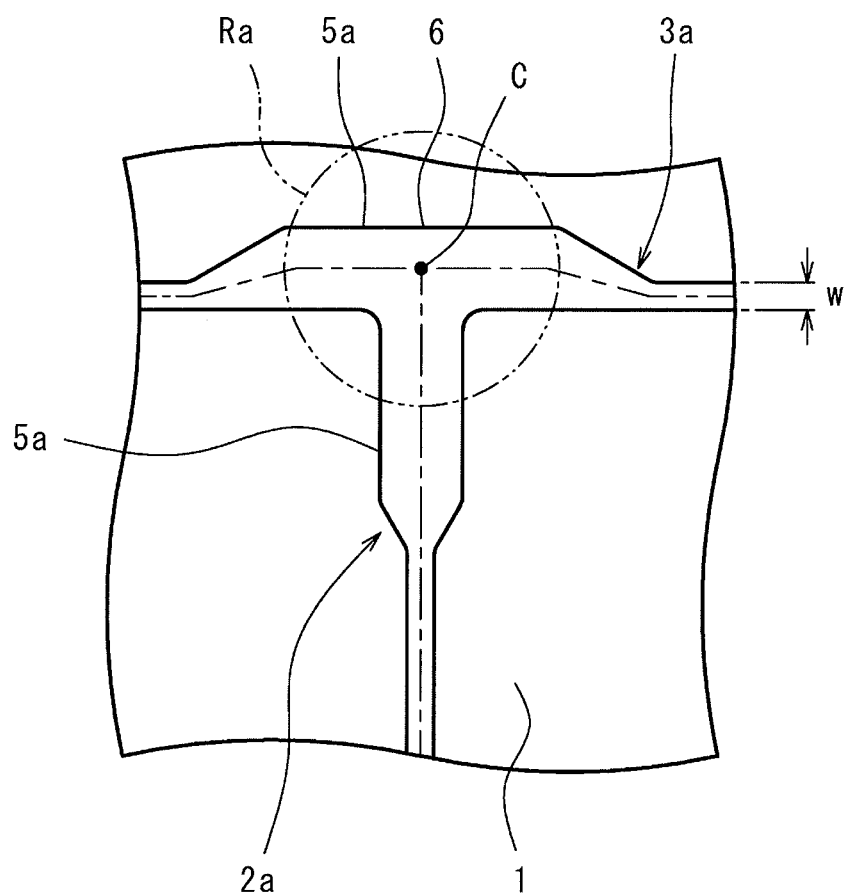
FIG. 2 is a schematic plan view of a flexible printed circuit board according to an embodiment of the present invention different from that illustrated in FIG. 1.

A flexible printed circuit board according to a second embodiment of the present invention illustrated in FIG. 2 includes an insulative base film 1 and a conductive pattern 2a provided on at least one surface of the base film 1.

The structure of the base film 1 included in the flexible printed circuit board illustrated in FIG. 2 may be similar to the structure of the base film 1 included in the flexible printed circuit board illustrated in FIG. 1. The structure of the conductive pattern 2a included in the flexible printed circuit board illustrated in FIG. 2 is similar to the structure of the conductive pattern 2 included in the flexible printed circuit board illustrated in FIG. 1 except for the characteristics in the shape thereof in plan view described below (and in the shape in plan view that is not particularly described). Accordingly, description of the flexible printed circuit board illustrated in FIG. 2 that is the same as that of the flexible printed circuit board illustrated in FIG. 1 will be omitted.

<Conductive Pattern>

The conductive pattern 2a is formed by at least partially patterning a conductor layer to form a circuit. The conductive pattern 2a includes at least one wiring line 3a. The wiring line 3a of the conductive pattern 2a may also include, for example, a branched portion 6 having an angle of greater than or equal to 60° (crossing angle of the centerlines of the wiring line is 900° 30°).

In the present embodiment, the wiring line 3a is provided with a relaxation structure that relaxes stress concentration at the branched portion and in which the wiring line 3a constitutes a wide wiring line 5a having a wiring line width that is greater than or equal to twice the minimum width w of the wiring line 3a in a surrounding region Ra including the branched portion 6 (region indicated by the two-dot chain line). More specifically, the minimum width of the wiring line 3a in the surrounding region Ra is greater than or equal to twice the minimum width w of the entire wiring line.

In the flexible printed circuit board illustrated in FIG. 2, the radius of curvature of the centerline of the wiring line 3a is less than or equal to 5 times the minimum width w of the entire wiring line 3a at only one point, that is, at point C. Therefore, the surrounding region Ra is regarded as the region inside a circle centered at the point C.

Advantages

As described above, the wiring line 3a constitutes the wide wiring line 5a in the surrounding region Ra in which the distance from the branched portion 6 is less than or equal to at least 5 times the minimum width w of the wiring line 3a. Accordingly, when the flexible printed circuit board receives a bending stress, stress concentration at the branched portion 6 of the wiring line 3a is relaxed, and breakage of the wiring line 3a at and around the branched portion 6 can be prevented.

Third Embodiment

Figure 3:
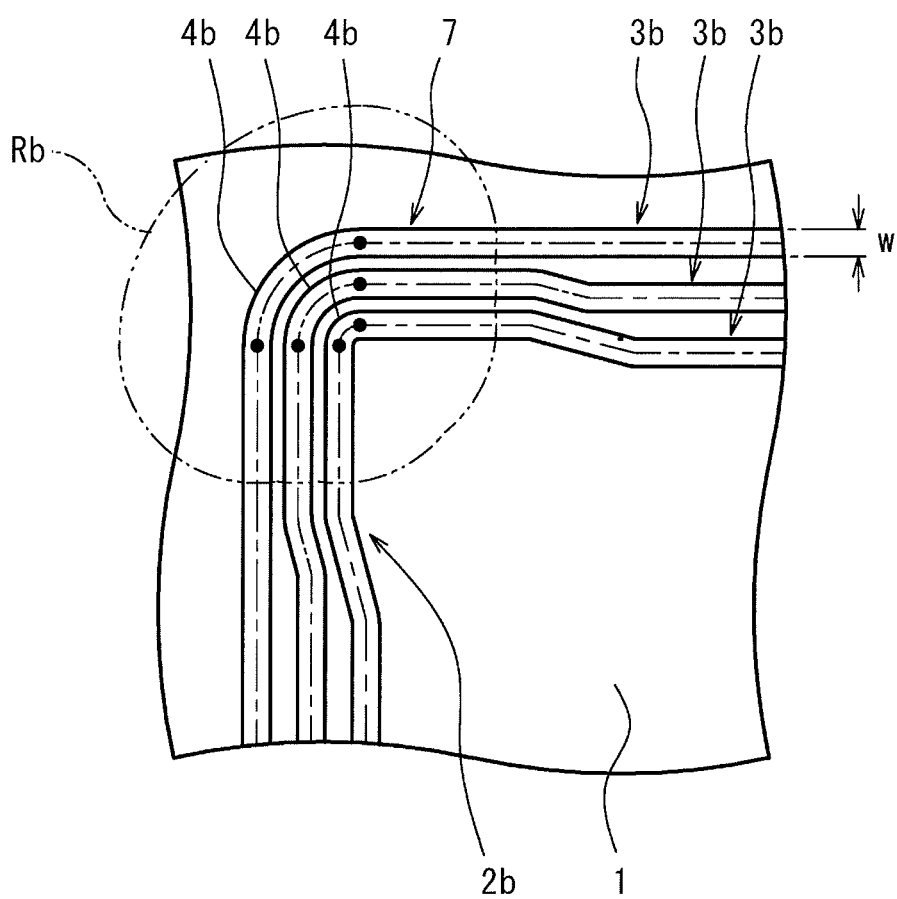
FIG. 3 is a schematic plan view of a flexible printed circuit board according to an embodiment of the present invention different from those illustrated in FIGS. 1 and 2.

A flexible printed circuit board according to a third embodiment of the present invention illustrated in FIG. 3 includes an insulative base film 1 and a conductive pattern 2b provided on at least one surface of the base film 1.

The structure of the base film 1 included in the flexible printed circuit board illustrated in FIG. 3 may be similar to the structure of the base film 1 included in the flexible printed circuit board illustrated in FIG. 1. The structure of the conductive pattern 2b included in the flexible printed circuit board illustrated in FIG. 3 is similar to the structure of the conductive pattern 2 included in the flexible printed circuit board illustrated in FIG. 1 except for the characteristics in the shape thereof in plan view described below (and in the shape in plan view that is not particularly described). Accordingly, description of the flexible printed circuit board illustrated in FIG. 3 that is the same as that of the flexible printed circuit board illustrated in FIG. 1 will be omitted.
<Conductive Pattern>

The conductive pattern 2b is formed by at least partially patterning a conductor layer to form a circuit. The conductive pattern 2b includes a plurality of wiring lines 3b. The wiring lines 3b each include a bent portion 4b having a radius of curvature of less than or equal to 5 times a minimum width w of the entire wiring lines 3b and an angle of greater than or equal to 60°.

In the present embodiment, the wiring lines 3b are provided with a relaxation structure that relaxes stress concentration at the bent portions 4b and in which the wiring lines 3b form a dense wiring line group 7 configured such that the ratio of the wiring line width to the wiring line interval is relatively large and that the total width thereof is relatively large in a surrounding region Rb including the bent portions 4b (region indicated by the two-dot chain line). More specifically, the wiring line interval of the wiring lines 3b is similar to that in a printed circuit board according to the related art in the region outside the surrounding region. In the surrounding region Rb, the wiring line interval is less than that in other regions.

The lower limit of the ratio of the wiring line width to the wiring line interval of the dense wiring line group 7 may be 1.5, preferably 2.0, and more preferably 2.5. The upper limit of the ratio of the wiring line width to the wiring line interval of the dense wiring line group 7 is preferably 10, and more preferably 5. When the ratio of the wiring line width to the wiring line interval of the dense wiring line group 7 is less than the lower limit, the integrity of the wiring lines 3b that constitute the dense wiring line group 7 may be insufficient, and there is a risk that stress concentration at the bent portions 4b cannot be sufficiently relaxed. When the ratio of the wiring line width to the wiring line interval of the dense wiring line group 7 is greater than the upper limit, there is a risk that the wiring line width will be excessively large and the area of the flexible printed circuit board will be unnecessarily large. There is also a risk that the wiring line interval will be excessively small and short-circuiting between the wiring lines 3b will occur.

The lower limit of the total width of the dense wiring line group 7 may be 2.0 times, preferably 2.5 times, and more preferably 3.0 times the minimum width w of the wiring lines 3b. The upper limit of the total width of the dense wiring line group 7 is preferably 20 times, and more preferably 10 times the minimum width w of the wiring lines 3b. When the total width of the dense wiring line group 7 is less than the lower limit, there is a risk that the stiffness of the dense wiring line group 7 will be insufficient and breakage of the wiring lines 3b at the bent portions 4b cannot be prevented. When the total width of the dense wiring line group 7 is greater than the upper limit, the area of the flexible printed circuit board may be insufficiently large.

The lower limit of the wiring line interval of the dense wiring line group 7 (gaps between the wiring lines 3b) is preferably 3 µm, and more preferably 5 µm. The upper limit of the wiring line interval of the dense wiring line group 7 is preferably 20 µm, and more preferably 15 µm. When the wiring line interval of the dense wiring line group 7 is less than the lower limit, there is a risk of short-circuiting between the wiring lines 3b. When the wiring line interval of the dense wiring line group 7 is greater than the upper limit, the wiring line width needs to be increased. Therefore, there is a risk that the area of the flexible printed circuit board will be unnecessarily large.

The number of wiring lines 3b included in the dense wiring line group 7 may be any number that is 2 or greater as long as the dense wiring line group 7 has the above-described total width.

Advantages

As described above, the wiring lines 3b constitute the dense wiring line group 7 in the surrounding region Rb in which the distance from the bent portions 4b is less than or equal to at least 5 times the minimum width w of the wiring lines 3b. Accordingly, when the flexible printed circuit board receives a bending stress, stress concentration at the bent portions 4b of the wiring lines 3b is relaxed, and breakage of the wiring lines 3b at and around the bent portions 4b can be prevented.

Fourth Embodiment

Figure 4:
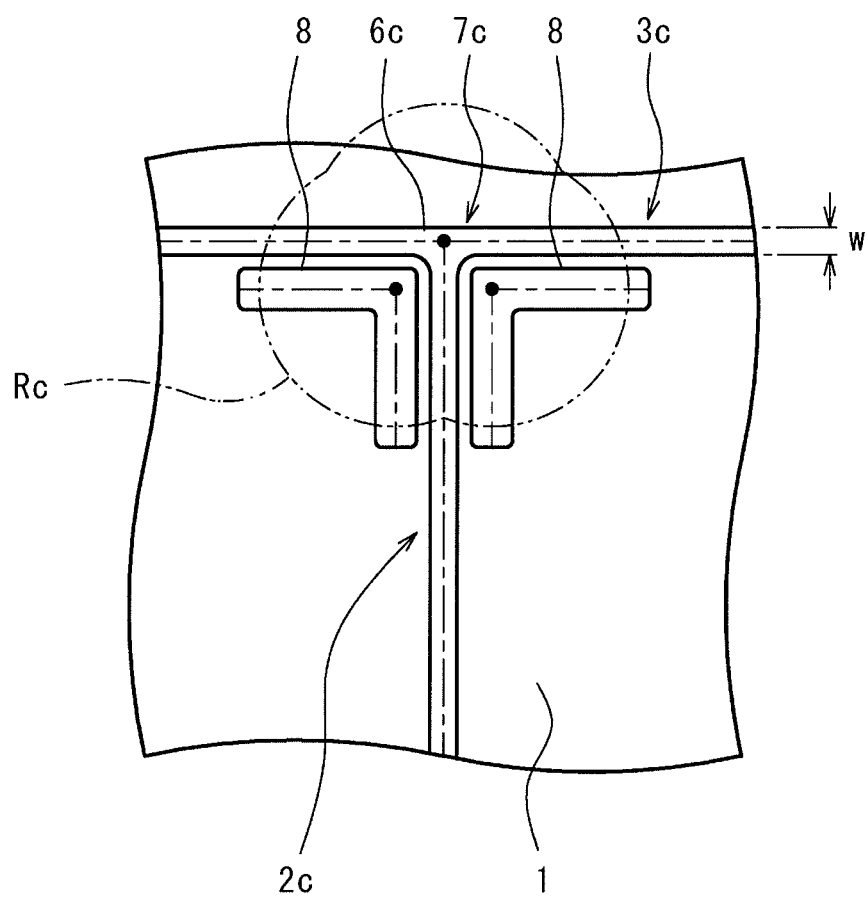
FIG. 4 is a schematic plan view of a flexible printed circuit board according to an embodiment of the present invention different from those illustrated in FIGS. 1, 2, and 3.

A flexible printed circuit board according to a fourth embodiment of the present invention illustrated in FIG. 4 includes an insulative base film 1 and a conductive pattern 2c provided on at least one surface of the base film 1.

The structure of the base film 1 included in the flexible printed circuit board illustrated in FIG. 4 may be similar to the structure of the base film 1 included in the flexible printed circuit board illustrated in FIG. 1. The structure of the conductive pattern 2c included in the flexible printed circuit board illustrated in FIG. 4 is similar to the structure of the conductive pattern 2 included in the flexible printed circuit board illustrated in FIG. 1 except for the characteristics in the shape thereof in plan view described below (and in the shape in plan view that is not particularly described). Accordingly, description of the flexible printed circuit board illustrated in FIG. 4 that is the same as that of the flexible printed circuit board illustrated in FIG. 1 will be omitted.
<Conductive Pattern>

The conductive pattern 2c is formed by at least partially patterning a conductor layer to form a circuit. The conductive pattern 2c includes a plurality of wiring lines 3c. The wiring lines 3c of the conductive pattern 2c include a branched portion 6c having an angle of greater than or equal to 60° (relative angle of the wiring lines is greater than or equal to 60°).

In the present embodiment, the wiring lines 3c are provided with a relaxation structure that relaxes stress concentration at the branched portion 6c and in which the wiring lines 3c constitute a dense wiring line group 7c configured such that the ratio of the wiring line width to the wiring line interval is relatively large and that the total width thereof is relatively large in a surrounding region Rc including the branched portion 6c (region indicated by the two-dot chain line). The dense wiring line group 7c includes dummy wiring lines 8 that are not connected to a circuit.

The dummy wiring lines 8 include bent portions. Therefore, the wiring lines 3c constitute the dense wiring line group 7c in the region in which the distance from the bent portions of the dummy wiring lines 8 is greater than or equal to at least 5 times the minimum width w of the wiring lines 3c.

The ratio of the wiring line width to the wiring line interval of the dense wiring line group 7c, the total width of the dense wiring line group 7c, and the number of wiring lines 3c in the flexible printed circuit board illustrated in FIG. 4 may be similar to the ratio of the wiring line width to the wiring line interval of the dense wiring line group 7, the total width of the dense wiring line group 7, and the number of wiring lines 3b in the flexible printed circuit board illustrated in FIG. 3.

Advantages

As described above, the wiring lines 3c form a dense wiring line group 7c in the surrounding region Rc in which the distance from the branched portion 6c is less than or equal to at least 5 times the minimum width w of the wiring lines 3c. Accordingly, when the flexible printed circuit board receives a bending stress, stress concentration at the branched portion 6c of the wiring lines 3c is relaxed, and breakage of the wiring lines 3c at and around the branched portion 6c can be prevented.

According to the relaxation structure of the above-described flexible printed circuit board, the conductive pattern 2 can be relatively easily designed because the dummy wiring lines 8 are simply provided adjacent to a branched wiring line pattern similar to that of the related art.

Fifth Embodiment

Figure 5:
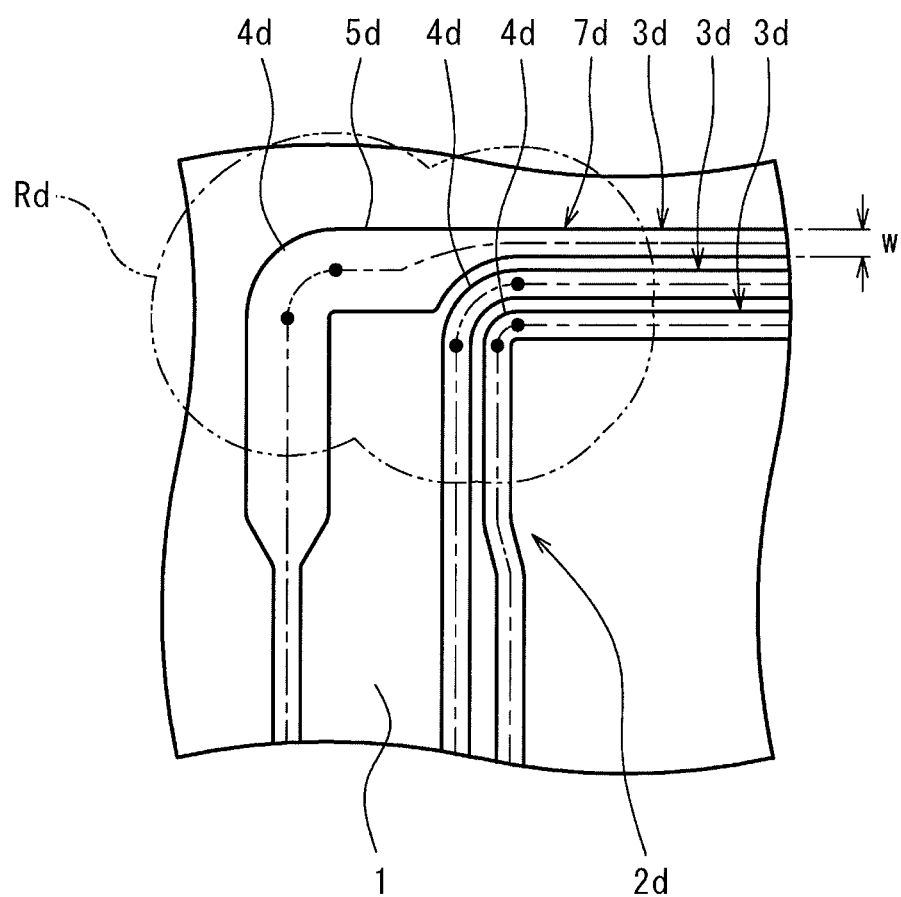
FIG. 5 is a schematic plan view of a flexible printed circuit board according to an embodiment of the present invention different from those illustrated in FIGS. 1 to 4.

A flexible printed circuit board according to a fifth embodiment of the present invention illustrated in FIG. 5 includes an insulative base film 1 and a conductive pattern 2d provided on at least one surface of the base film 1.

The structure of the base film 1 included in the flexible printed circuit board illustrated in FIG. 5 may be similar to the structure of the base film 1 included in the flexible printed circuit board illustrated in FIG. 1. The structure of the conductive pattern 2d included in the flexible printed circuit board illustrated in FIG. 5 is similar to the structure of the conductive pattern 2 included in the flexible printed circuit board illustrated in FIG. 1 except for the characteristics in the shape thereof in plan view described below (and in the shape in plan view that is not particularly described). Accordingly, description of the flexible printed circuit board illustrated in FIG. 5 that is the same as that of the flexible printed circuit board illustrated in FIG. 1 will be omitted.

<Conductive Pattern>

The conductive pattern 2d is formed by at least partially patterning a conductor layer to form a circuit. The conductive pattern 2d includes a plurality of wiring lines 3d. The wiring lines 3d each include a bent portion 4d having a radius of curvature of less than or equal to 5 times a minimum width w of the entire wiring lines 3d and an angle of greater than or equal to 60°.

In the present embodiment, the wiring lines 3d are provided with a relaxation structure that relaxes stress concentration at the bent portions 4d and in which the wiring lines 3d constitute a wide wiring line 5d or a dense wiring line group 7d in a surrounding region Rd including the bent portions 4d (region indicated by the two-dot chain line). The dense wiring line group 7d partially includes a wide wiring line 5d.

The wiring line width, etc., of the wide wiring line 5d of the flexible printed circuit board illustrated in FIG. 5 may be similar to the wiring line width, etc., of the wide wiring line 5 of the flexible printed circuit board illustrated in FIG. 1. In addition, the total width, etc., of the dense wiring line group 7d of the flexible printed circuit board illustrated in FIG. 5 may be similar to the total width, etc., of the dense wiring line group 7 of the flexible printed circuit board illustrated in FIG. 3.

Advantages

As described above, the wiring lines 3d constitute the wide wiring line 5d or the dense wiring line group 7d in the surrounding region Rd in which the distance from the bent portions 4d is less than or equal to at least 5 times the minimum width w of the wiring lines 3d. Accordingly, when the flexible printed circuit board receives a bending stress, stress concentration at the bent portions 4d of the wiring lines 3d is relaxed, and breakage of the wiring lines 3d at and around the bent portions 4d can be prevented.

Sixth Embodiment

Figure 6:
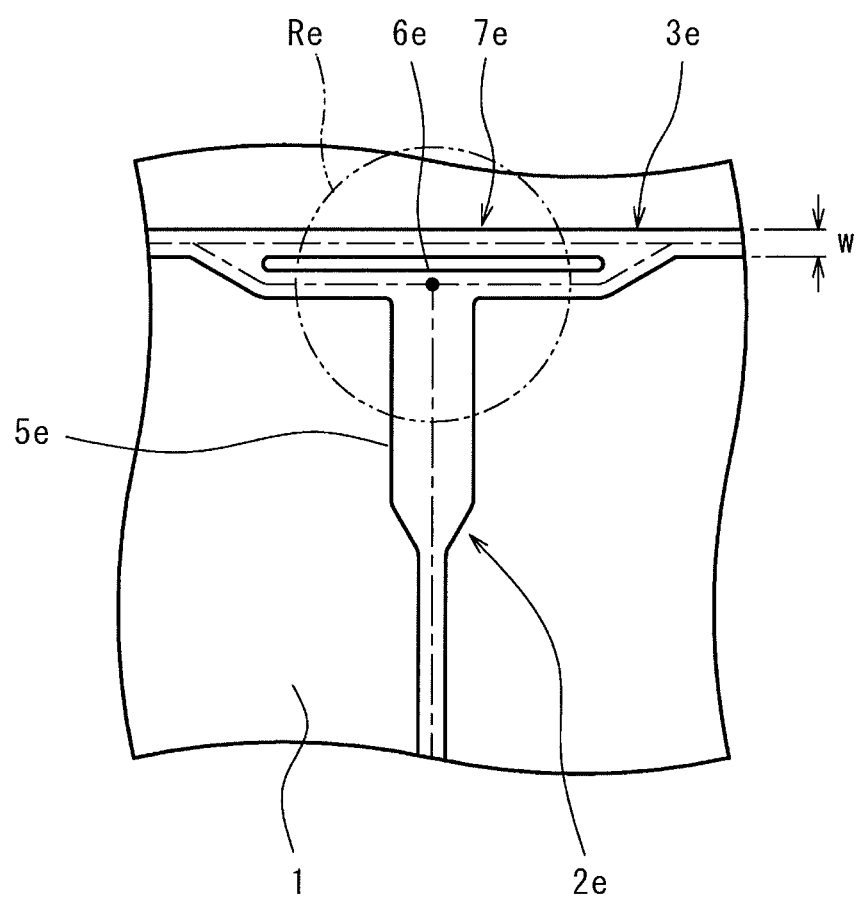
FIG. 6 is a schematic plan view of a flexible printed circuit board according to an embodiment of the present invention different from those illustrated in FIGS. 1 to 5.

A flexible printed circuit board according to a sixth embodiment of the present invention illustrated in FIG. 6 includes an insulative base film 1 and a conductive pattern 2e provided on at least one surface of the base film 1.

The structure of the base film 1 included in the flexible printed circuit board illustrated in FIG. 6 may be similar to the structure of the base film 1 included in the flexible printed circuit board illustrated in FIG. 1. The structure of the conductive pattern 2e included in the flexible printed circuit board illustrated in FIG. 6 is similar to the structure of the conductive pattern 2 included in the flexible printed circuit board illustrated in FIG. 1 except for the characteristics in the shape thereof in plan view described below (and in the shape in plan view that is not particularly described). Accordingly, description of the flexible printed circuit board illustrated in FIG. 6 that is the same as that of the flexible printed circuit board illustrated in FIG. 1 will be omitted.

<Conductive Pattern>

The conductive pattern 2e is formed by at least partially patterning a conductor layer to form a circuit. The conductive pattern 2e includes a wiring line 3e. The wiring line 3e includes a branched portion 6e.

In the present embodiment, the wiring line 3e is provided with a relaxation structure that relaxes stress concentration at the branched portion 6e and in which the wiring line 3e constitutes a wide wiring line 5e or a dense wiring line group 7e in a surrounding region Re including the branched portion 6e (region indicated by the two-dot chain line). More specifically, the wiring line 3e is approximately T-shaped in the surrounding region Re, and a horizontally extending portion of the letter 'T' serves as a dense wiring line group 7e and a vertically extending portion of the letter 'T' serves as a wide wiring line 5e.

The wiring line width, etc., of the wide wiring line 5e of the flexible printed circuit board illustrated in FIG. 6 may be similar to the wiring line width, etc., of the wide wiring line 5 of the flexible printed circuit board illustrated in FIG. 1. In addition, the total width, etc., of the dense wiring line group 7e of the flexible printed circuit board illustrated in FIG. 6 may be similar to the total width, etc., of the dense wiring line group 7 of the flexible printed circuit board illustrated in FIG. 3.

Advantages

As described above, the wiring line 3e constitutes the wide wiring line 5e or the dense wiring line group 7e in the surrounding region Re in which the distance from the branched portion 6e is less than or equal to at least 5 times the minimum width w of the wiring line 3e. Accordingly, when the flexible printed circuit board receives a bending stress, stress concentration at the branched portion 6e of the wiring line 3e is relaxed, and breakage of the wiring line 3e at and around the branched portion 6e can be prevented.

Seventh Embodiment

Figure 7:
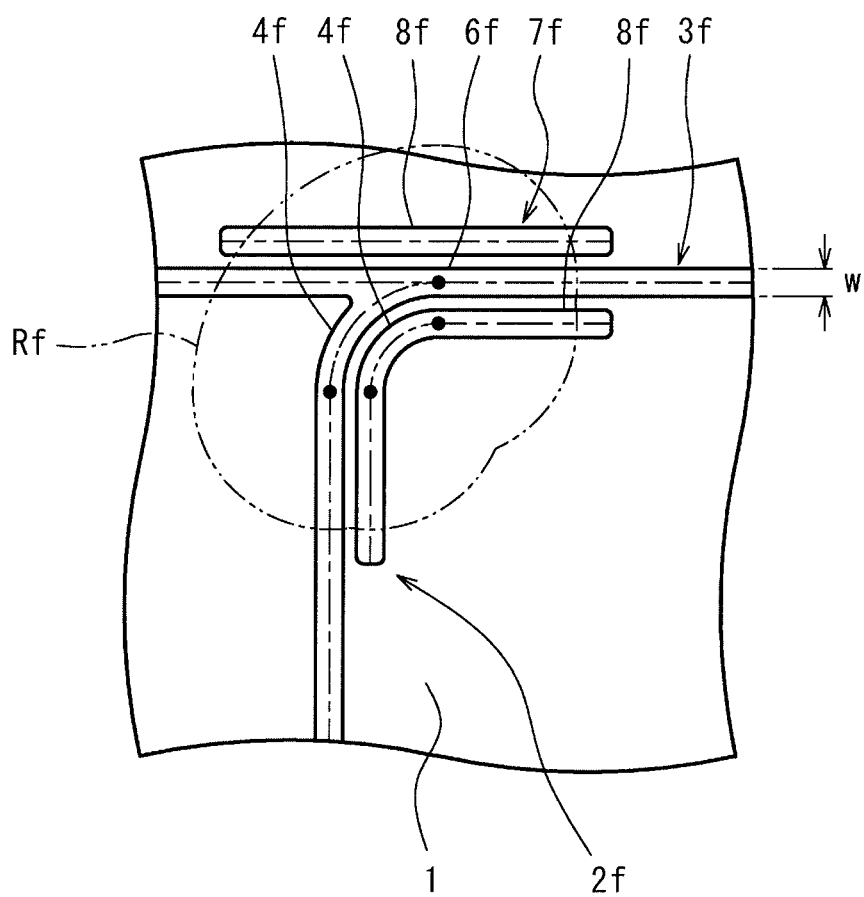
FIG. 7 is a schematic plan view of a flexible printed circuit board according to an embodiment of the present invention different from those illustrated in FIGS. 1 to 6.

A flexible printed circuit board according to a seventh embodiment of the present invention illustrated in FIG. 7 includes an insulative base film 1 and a conductive pattern 2f provided on at least one surface of the base film 1.

The structure of the base film 1 included in the flexible printed circuit board illustrated in FIG. 7 may be similar to the structure of the base film 1 included in the flexible printed circuit board illustrated in FIG. 1. The structure of the conductive pattern 2f included in the flexible printed circuit board illustrated in FIG. 7 is similar to the structure of the conductive pattern 2 included in the flexible printed circuit board illustrated in FIG. 1 except for the characteristics in the shape thereof in plan view described below (and in the shape in plan view that is not particularly described). Accordingly, description of the flexible printed circuit board illustrated in FIG. 7 that is the same as that of the flexible printed circuit board illustrated in FIG. 1 will be omitted.

<Conductive Pattern>

The conductive pattern 2f is formed by at least partially patterning a conductor layer to form a circuit. The conductive pattern 2f includes a wiring line 3f. The wiring line 3f is branched while being bent at a radius of curvature that is less than or equal to 5 times the minimum width w of the wiring line 3f. Therefore, the wiring line 3f includes a bent portion 4f. The relative angle between the centerlines at both ends of a portion in which the radius of curvature is less than or equal to 5 times the minimum width w of the wiring line 3f is greater than or equal to 60°. Therefore, this portion can be regarded as a branched portion 6f having an angle of greater than or equal to 60 degrees.

In the present embodiment, the wiring line 3f is provided with a relaxation structure that relaxes stress concentration at the bent portion 4f (branched portion 6f) and in which the wiring line 3f constitutes a dense wiring line group 7f configured such that the ratio of the wiring line width to the wiring line interval is relatively large and that the total width thereof is relatively large in a surrounding region Rf including the bent portions 4f (region indicated by the two-dot chain line). The dense wiring line group 7f includes a dummy wiring line 8f that is not connected to a circuit.

The total width, etc., of the dense wiring line group 7f of the flexible printed circuit board illustrated in FIG. 7 may be similar to the total width, etc., of the dense wiring line group 7 of the flexible printed circuit board illustrated in FIG. 3.

Advantages

As described above, the wiring line 3f constitutes the dense wiring line group 7f in the surrounding region Rf in which the distance from the bent portion 4f and the branched portion 6f is less than or equal to at least 5 times the minimum width w of the wiring line 3f. Accordingly, when the flexible printed circuit board receives a bending stress, stress concentration at the bent portion 4f and the branched portion 6f of the wiring line 3f is relaxed, and breakage of the wiring line 3f at and around the bent portion 4f and the branched portion 6f can be prevented.

Other Embodiments

It is to be understood that the embodiments disclosed herein are examples and not restrictive in all respects. The scope of the present invention is not limited by the configuration of the above-described embodiment but is defined by the claims, and is intended to include equivalents to the scope of the claims and all modifications within the scope of the claims.

For example, the shape of the wiring line or wiring lines on the flexible printed circuit board in plan view is not limited to the shapes described in the above-described embodiments as long as the wiring line or wiring lines constitute a wide wiring line or a dense wiring line group in the region in which the distance from the bent portion or the branched portion is less than or equal to 5 times the minimum width of the wiring line or wiring lines. The shape of the wiring line or wiring lines in the surrounding region including the bent portion or the branched portion in plan view may be any combination of the wide wiring line and the dense wiring line group. For example, a dummy wiring line may be arranged adjacent to a bent portion of a single wiring line to form a dense wiring line group in a surrounding region including the bent portion.

The flexible printed circuit board is preferably configured such that wiring lines included in the surrounding regions for all of the bent portions and the branched portions constitute a wide wiring line or a dense wiring line group. However, the flexible printed circuit board may instead be formed such that the wiring line or wiring lines included in the surrounding region for at least one bent portion or branched portion constitute a wide wiring line or a dense wiring line group.

The flexible printed circuit board may include other components, such as a coverlay and mounting components.

The flexible printed circuit board may be configured such that a portion of a wiring line connected to a wide wiring line at the bent portion or the branched portion may be a wide wiring line. In other words, the present invention may be applied to a portion in which a wiring line is branched or bent and in which the wiring line width thereof changes.

The flexible printed circuit board may be configured such that the wiring lines in the surrounding region including the bent portion constitute a dense wiring line group including a dummy wiring line, and the dummy wiring line included in the dense wiring line group may be arranged on either side of the wiring lines that form a circuit.

REFERENCE SIGNS LIST 1 base film
2, 2a, 2b, 2c, 2d, 2e, 2f conductive pattern
3, 3a, 3b, 3c, 3d, 3e, 3f wiring line
4, 4b, 4d, 4f bent portion
5, 5a, 5d, 5e wide wiring line
6, 6c, 6e, 6f branched portion
7, 7c, 7d, 7e, 7f dense wiring line group
8, 8f dummy wiring line
w minimum width
R, Ra, Rb, Rc, Rd, Re, Rf surrounding region

The invention claimed is:

1. A flexible printed circuit board comprising:
an insulative base film; and
a conductive pattern provided on at least one surface of the insulative base film and including at least one wiring line including a bent portion having an angle of greater than or equal to 60° or a branched portion having an angle of greater than or equal to 60° in plan view,
wherein the at least one wiring line is provided with a relaxation structure that relaxes stress concentration at the bent portion or the branched portion,
wherein the relaxation structure is structured such that the at least one wiring line includes a dense wiring line group, including a plurality of wiring lines, in a surrounding region including the bent portion or the branch portion, the surrounding region extending such that a distance from a centerline of the bent portion or the branched portion of each wiring line of the dense wiring line group to respective end portions of each wiring line of the dense wiring line group is greater than or equal to 5 times a minimum width of a wiring line of the at least one wiring line outside of the relaxation structure and less than or equal to 30 times the minimum width of the wiring line of the at least one wiring line outside of the relaxation structure,
wherein a ratio of a wiring line width to a wiring line interval of each wiring line of the dense wiring line group is greater than a ratio of a wiring line width to a wiring line interval of each wiring line outside of the relaxation structure, and
wherein the ratio of the wiring line width to the wiring line interval of each wiring line of the dense wiring line group is greater than or equal to 2.5 and less than or equal to 10, and a total width of the dense wiring line group is greater than or equal to 3 times the minimum width of the wiring line of the at least one wiring line outside of the relaxation structure and less than or equal to 10 times the minimum width of the wiring line of the at least one wiring line outside of the relaxation structure, the total width of the dense wiring line group being a sum of wiring line widths of each wiring line of the plurality of wiring lines of the dense wiring line group.

2. The flexible printed circuit board according to claim 1, wherein the plurality of wiring lines of the dense wiring line group includes a dummy wiring line that is not connected to a circuit.

3. The flexible printed circuit board according to claim 1, wherein the wiring line interval of the dense wiring line group is less than or equal to 20 μm.

* * * * *